(12) United States Patent
Hoerich et al.

(10) Patent No.: US 10,783,897 B2
(45) Date of Patent: Sep. 22, 2020

(54) EFFICIENT DRC PROFILE TRANSMISSION

(71) Applicant: DOLBY INTERNATIONAL AB, Amsterdam, Zuidoost (NL)

(72) Inventors: Holger Hoerich, Furth (DE); Jeroen Koppens, Nederweert (NL)

(73) Assignee: Dolby International AB, Amsterdam Zuidoost (NL)

( * ) Notice: Subject to any disclaimer, the term of this patent is extended or adjusted under 35 U.S.C. 154(b) by 0 days.

(21) Appl. No.: 16/420,473

(22) Filed: May 23, 2019

(65) Prior Publication Data

US 2019/0279652 A1  Sep. 12, 2019

Related U.S. Application Data

(63) Continuation of application No. 16/026,529, filed on Jul. 3, 2018, now Pat. No. 10,354,670, which is a (Continued)

(51) Int. Cl.
*H03G 3/00* (2006.01)
*G10L 19/16* (2013.01)
(Continued)

(52) U.S. Cl.
CPC .......... *G10L 19/167* (2013.01); *G10L 19/26* (2013.01); *G10L 21/0364* (2013.01);
(Continued)

(58) Field of Classification Search
CPC ...................................................... H03G 3/00
See application file for complete search history.

(56) References Cited

U.S. PATENT DOCUMENTS 5,864,682 A  1/1999  Porter
6,104,441 A  8/2000  Wee
(Continued)

FOREIGN PATENT DOCUMENTS

CN  101295504  10/2008
CN  102171755  8/2011
(Continued)

OTHER PUBLICATIONS

ATSC "Recommended Practice: Guide to the Use of the ATSC Digital Television Standard, including Corrigendum No. 1" Doc. A/54A, Oct. 4, 1995, pp. 1-110.
(Continued)

*Primary Examiner* — Olisa Anwah

(57) ABSTRACT

A method (600) for decoding an encoded audio signal (102) is described. The encoded audio signal (102) comprises a sequence of frames. Furthermore, the encoded audio signal (102) is indicative of a plurality of different dynamic range control (DRC) profiles for a corresponding plurality of different rendering modes. Different subsets of DRC profiles from the plurality of DRC profiles are comprised within different frames of the sequence of frames, such that two or more frames of the sequence of frames jointly comprise the plurality of DRC profiles. The method (600) comprises determining a first rendering mode from the plurality of different rendering modes; determining (609, 610) one or more DRC profiles from a subset of DRC profiles comprised within a current frame of the sequence of frames; determining (611) whether at least one of the one or more DRC profiles is applicable to the first rendering mode; selecting (604) a default DRC profile as a current DRC profile, if none of the one or more DRC profiles is applicable to the first rendering mode; wherein definition data of the default DRC profile is known at a decoder (100) for decoding the encoded
(Continued)

audio signal (102); and decoding the current frame using the current DRC profile.

15 Claims, 7 Drawing Sheets

Related U.S. Application Data continuation of application No. 15/513,546, filed as application No. PCT/EP2015/072371 on Sep. 29, 2015, now Pat. No. 10,020,001.

(60) Provisional application No. 62/058,228, filed on Oct. 1, 2014.

(51) Int. Cl.

| | | |
|---|---|---|
| *H03G 7/00* | (2006.01) | |
| *G10L 21/0364* | (2013.01) | |
| *G10L 19/26* | (2013.01) | |
| *H03G 9/00* | (2006.01) | |
| *H04N 21/233* | (2011.01) | |

(52) U.S. Cl.
CPC .............. *H03G 7/002* (2013.01); *H03G 7/007* (2013.01); *H03G 9/005* (2013.01); *H04N 21/233* (2013.01)

(56) References Cited

U.S. PATENT DOCUMENTS

| | | |
|---|---|---|
| 6,285,826 B1 | 9/2001 | Murase |
| 8,144,881 B2 | 3/2012 | Crockett |
| 8,195,454 B2 | 6/2012 | Muesch |
| 8,199,834 B2 | 6/2012 | Scarpino |
| 8,379,880 B2 | 2/2013 | Riedl |
| 8,468,426 B2 | 6/2013 | Bims |
| 9,559,651 B2 | 1/2017 | Baumgarte |
| 9,628,037 B2 | 4/2017 | Riedl |
| 2004/0261111 A1 | 12/2004 | Aboulgasem |
| 2005/0078840 A1 | 4/2005 | Riedl |
| 2005/0238100 A1 | 10/2005 | Hsiao |
| 2006/0233201 A1 | 10/2006 | Wiesenthal |
| 2009/0296624 A1 | 12/2009 | Ryu |
| 2010/0083344 A1 | 4/2010 | Schildbach |
| 2011/0246603 A1 | 10/2011 | Lee |
| 2012/0310654 A1 | 12/2012 | Riedmiller |
| 2013/0144631 A1 | 6/2013 | Miyasaka |
| 2013/0268502 A1 | 10/2013 | Yang |
| 2014/0294200 A1 | 10/2014 | Baumgarte |
| 2016/0196830 A1 | 7/2016 | Riedmiller |
| 2016/0197590 A1 | 7/2016 | Koppens |
| 2016/0219387 A1 | 7/2016 | Ward |
| 2017/0193638 A1 | 7/2017 | Grundy |
| 2017/0229134 A1 | 8/2017 | Baumgarte |

FOREIGN PATENT DOCUMENTS

| | | |
|---|---|---|
| CN | 102741883 | 10/2012 |
| CN | 103460716 | 12/2013 |
| CN | 103582913 | 2/2014 |
| JP | 2013223055 | 10/2013 |
| WO | 2014/113471 | 7/2014 |
| WO | 2014/114781 | 7/2014 |
| WO | 2014124377 | 8/2014 |
| WO | 2015/038522 | 3/2015 |

OTHER PUBLICATIONS

Carroll, T. et al "Audio for Digital Television" Chapter 5.18, pp. 1309-1330, NAB Engineering Handbook.

DVB Organization: "AC-3, E-AC-3 and AC-4 Intelligent Loudness, Compliance & Advanced DRC Signaling" Apr. 2014, pp. 1-32.

ETSI TS 102 005 V1.3.1. "Digital Video Broadcasting (DVB): Specification for the Use of Video and Audio Coding in DVB Services Delivered Directly over IP Protocols", Jul. 2007, pp. 1-49.

ETSI TS 103 190 V1.1.1 "Digital Audio Compression (AC-4) Standard" Apr. 2014, pp. 1-295.

Heuberger, Albert "HE-AAC Metadata for Digital Broadcasting" Fraunhofer Institute for Integrated Circuits, 2013, pp. 1-16.

Meltzer, S. et al "MPEG-4 HE-AAC v2—Audio Coding for Today's Digital Media world" pp. 1-12, Jan. 2006.

Wei, T. et al "Rate-Distortion Optimized Frame Dropping and Scheduling for Multi-User Conversational and Streaming Video" Journal of Zhejiang University Science A, 2006, pp. 864-872.

Zheng, B. et al "TSFD: Two Stage Frame Dropping for Scalable Video Transmission over Data Networks" IEEE Workshop on High Performance Switching and Routing, May 29-31, 2001.

EFFICIENT DRC PROFILE TRANSMISSION

CROSS-REFERENCE TO RELATED APPLICATIONS

This application is a Continuation from U.S. patent application Ser. No. 16/026,529 filed Jul. 3, 2018 which is a U.S. Continuation patent application from U.S. patent application Ser. No. 15/513,546 filed Mar. 22, 2017, now U.S. Pat. No. 10,020,001 issued Jul. 10, 2018 which is the U.S. national stage of PCT International Application No. PCT/EP2015/072371 filed Sep. 29, 2015 which claims the benefit of priority from U.S. Provisional Patent Application No. 62/058,228 filed Oct. 1, 2014, which are all hereby incorporated by reference in their entirety.

TECHNICAL FIELD

The present document relates to the processing of audio signals. In particular, the present document relates to a method and a corresponding system for transmitting Dynamic Range Control (DRC) profiles in a bandwidth efficient manner.

BACKGROUND

The increasing popularity of media consumer devices has created new opportunities and challenges for the creators and distributors of media content for playback on those devices, as well as for the designers and manufacturers of the devices. Many consumer devices are capable of playing back a broad range of media content types and formats including those often associated with high-quality, wide bandwidth and wide dynamic range audio content for HDTV, Blu-ray or DVD. Media processing devices may be used to play back this type of audio content either on their own internal acoustic transducers or on external transducers such as headphones or high quality home theater systems; however, all these playback systems and environment pose significantly different requirements on the dynamic range of the audio signal due to varying noise levels in the environment or due to the limited capability of the playback system to reproduce the required sound pressure levels without distortion. Limiting the dynamic range depending on the environment is an approach to provide high quality and intelligibility across a broad range of different rendering devices having different rendering capabilities and listening environments, i.e. across a broad range of rendering modes.

The present document addresses the technical problem of providing creators and distributors of media content with bandwidth efficient means for enabling the reproduction of audio signals at high quality and intelligibility on a broad range of different rendering devices having different rendering capabilities.

SUMMARY

According to an aspect a method for generating an encoded audio signal is described. The encoded audio signal comprises a sequence of frames. The encoded audio signal is indicative of a plurality of different dynamic range control (DRC) profiles for a corresponding plurality of different rendering modes. The method comprises inserting different subsets of DRC profiles from the plurality of DRC profiles into different frames of the sequence of frames, such that two or more frames of the sequence of frames jointly comprise the plurality of DRC profiles.

According to a further aspect, a method for decoding an encoded audio signal is described. The encoded audio signal comprises a sequence of frames. Furthermore, the encoded audio signal is indicative of a plurality of different dynamic range control (DRC) profiles for a corresponding plurality of different rendering modes. Different subsets of DRC profiles from the plurality of DRC profiles are comprised within different frames of the sequence of frames, such that two or more frames of the sequence of frames jointly comprise the plurality of DRC profiles. The method comprises determining a first rendering mode from the plurality of different rendering modes, and determining one or more DRC profiles from a subset of DRC profiles comprised within a current frame of the sequence of frames. Furthermore, the method comprises determining whether at least one of the one or more DRC profiles is applicable to the first rendering mode. In addition, the method comprises selecting a default DRC profile as a current DRC profile, if none of the one or more DRC profiles is applicable to the first rendering mode, wherein definition data of the default DRC profile is known at a decoder for decoding the encoded audio signal. Furthermore, the method comprises decoding the current frame using the current DRC profile.

According to a further aspect, a bitstream comprising an encoded audio signal is described. The encoded audio signal comprises a sequence of frames. The encoded audio signal is indicative of a plurality of different dynamic range control (DRC) profiles for a corresponding plurality of different rendering modes. The different subsets of DRC profiles from the plurality of DRC profiles are comprised within different frames of the sequence of frames, such that two or more frames of the sequence of frames jointly comprise the plurality of DRC profiles.

According to another aspect, an encoder for generating an encoded audio signal is described. The encoded audio signal comprises a sequence of frames. The encoded audio signal is indicative of a plurality of different dynamic range control (DRC) profiles for a corresponding plurality of different rendering modes. The encoder is configured to insert different subsets of DRC profiles from the plurality of DRC profiles into different frames of the sequence of frames, such that two or more frames of the sequence of frames jointly comprise the plurality of DRC profiles.

According to a further aspect, a decoder for decoding an encoded audio signal is described. The encoded audio signal comprises a sequence of frames. The encoded audio signal is indicative of a plurality of different dynamic range control (DRC) profiles for a corresponding plurality of different rendering modes. The different subsets of DRC profiles from the plurality of DRC profiles are comprised within different frames of the sequence of frames, such that two or more frames of the sequence of frames jointly comprise the plurality of DRC profiles. The decoder is configured to determine a first rendering mode from the plurality of different rendering modes, to determine one or more DRC profiles from a subset of DRC profiles comprised within a current frame of the sequence of frames, to determine whether at least one of the one or more DRC profiles is applicable to the first rendering mode, to select a default DRC profile as a current DRC profile, if none of the one or more DRC profiles is applicable to the first rendering mode; wherein definition data of the default DRC profile is known at the decoder; and to decode the current frame using the current DRC profile.

According to a further aspect, a software program is described. The software program may be adapted for execution on a processor and for performing the method steps outlined in the present document when carried out on the processor.

According to another aspect, a storage medium is described. The storage medium may comprise a software program adapted for execution on a processor and for performing the method steps outlined in the present document when carried out on the processor.

According to a further aspect, a computer program product is described. The computer program may comprise executable instructions for performing the method steps outlined in the present document when executed on a computer.

It should be noted that the methods and systems including its preferred embodiments as outlined in the present patent application may be used stand-alone or in combination with the other methods and systems disclosed in this document. Furthermore, all aspects of the methods and systems outlined in the present patent application may be arbitrarily combined. In particular, the features of the claims may be combined with one another in an arbitrary manner.

SHORT DESCRIPTION OF THE FIGURES

The invention is explained below in an exemplary manner with reference to the accompanying drawings, wherein FIG. 1 and FIG. 2 illustrate an example audio decoder and an example audio encoder, respectively;

Figure 6A:
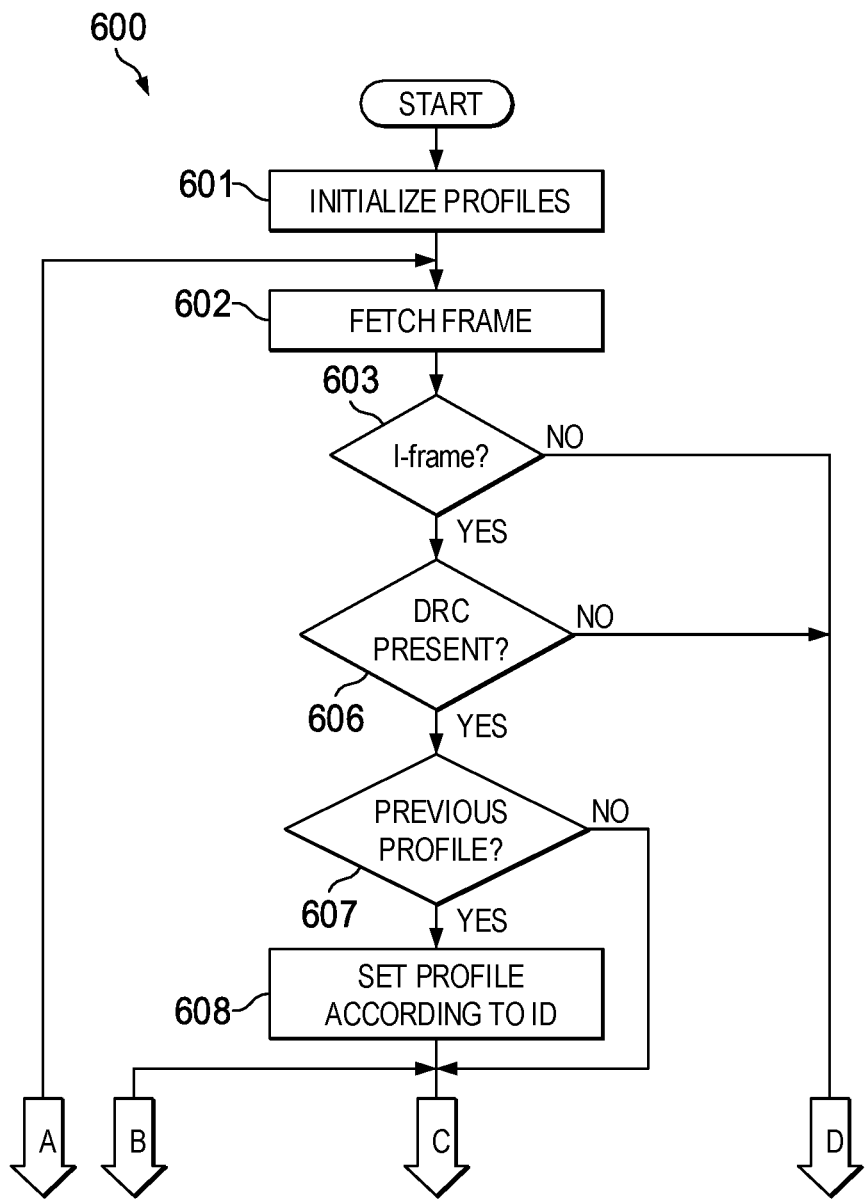
Figure 6B:
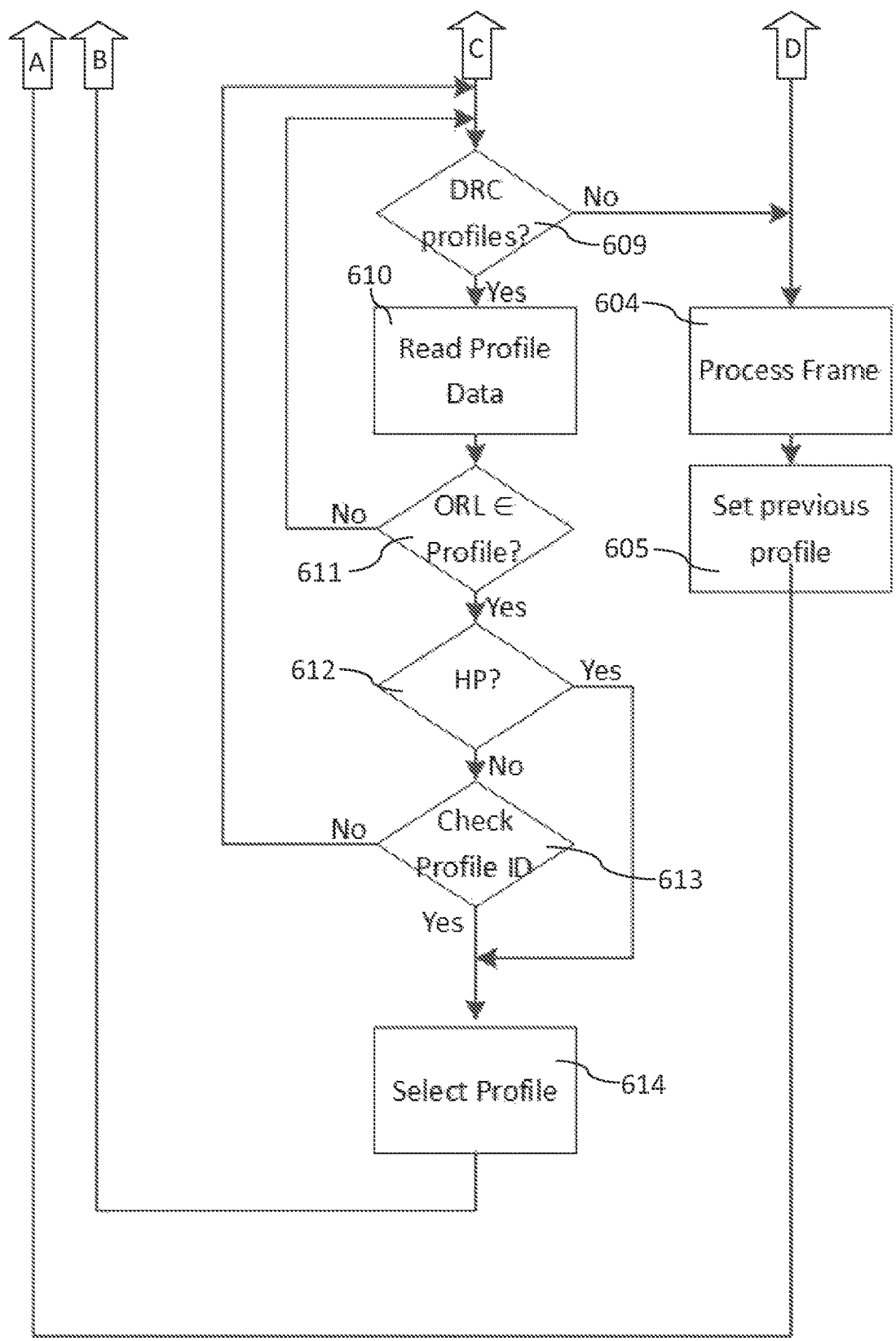

FIG. 6, consisting of FIG. 6A and FIG. 6B, shows a flow chart of an example method for selecting a DRC profile.

DETAILED DESCRIPTION

As indicated above, the present document addresses the technical problem of enabling a designer and/or distributor of audio content to control the quality and intelligibility of the audio content for different types of rendering modes. An example rendering mode is a home theatre rendering mode, where audio content is played back using transducers which typically allow for a very wide dynamic range in a quiet environment. Another example rendering mode is a flat-panel mode, where the audio content is played back using transducers of e.g. a TV set, which typically allow for a reduced dynamic range compared to a home theatre. A further example rendering mode is a portable speaker mode, where the audio content is played back using the loudspeakers of a portable electronic device (such as a smartphone). The dynamic range of this rendering mode is typically small compared to the above mentioned rendering modes and often the environment is noisy.

Another example rendering mode is a portable headphone mode, where the audio content is played back using headphones in conjunction with a portable electronic device. The dynamic range is limited but typically higher than the dynamic range which is provided by the loudspeakers of the portable electronic device.

In order to allow for a high quality and high intelligibility for the different rendering modes, different DRC (Dynamic Range Control) profiles for the different rendering modes may be provided along with the audio content. The audio content may be transmitted in a sequence of frames. The sequence of frames may comprise I (i.e. independent) frames which may be decoded independently from previous or succeeding frames. Furthermore, the sequence of frames may comprise other types of frames (e.g. P and/or B frames) which typically exhibit a dependency with regards to a previous and/or a succeeding frame. At least some of the frames of the sequence of frames may comprise a plurality of different DRC profiles for a plurality of different rendering modes. In particular, the I-frames of the sequence of frames may comprise the plurality of DRC profiles.

By inserting a plurality of different DRC profiles into a sequence of audio frames, an audio decoder is enabled to select an appropriate DRC profile for a particular rendering mode. As a result, it may be ensured that the rendered audio signal has a high quality (notably no clipping or distortion introduced by the transducers) and a high intelligibility.

In the following, various aspects of dynamic range control are described. Without customized dynamic range control, input audio information (e.g., PCM samples, time-frequency samples in a QMF matrix, etc.) is often reproduced at a playback device at loudness levels that are inappropriate for the playback device's specific playback environment (that is, including the device's physical and/or mechanical playback limitations), as the playback device's specific playback environment might be different from a target playback environment for which the encoded audio content had been coded at an encoding device.

Techniques as described herein can be used to support dynamic range control of a wide variety of audio content customized to any of a wide variety of playback environments while maintaining perceptual qualities of the audio content and while maintaining an artist's intent of adapting the content to different listening environments.

Dynamic Range Control (DRC) refers to time-variant, level-dependent audio processing operations that alter (e.g., compress, cut, expand, boost, etc.) the signal in order to convert an input dynamic range of loudness levels in audio content into an output dynamic range that is different from the input dynamic range. For example, in a dynamic range control scenario, soft sounds may be mapped (e.g., boosted, etc.) to higher loudness levels and loud sounds may be mapped (e.g., cut, etc.) to lower loudness values. As a result, in a loudness domain, an output range of loudness levels becomes smaller than the input range of loudness levels in this example. In some embodiments, the dynamic range control, however, may be reversible so that the original range is restored. For example, an expansion operation may be performed to recover the original range so long as mapped loudness levels in the output dynamic range, as mapped from original loudness levels, are at or below a clipping level, each unique original loudness level is mapped to a unique output loudness level, etc.

DRC techniques as described herein can be used to provide a better listening experience in certain playback environments or situations. For example, soft sounds in a noisy environment may be masked by the noise that renders the soft sounds inaudible. Conversely, loud sounds may not be desired in some situations, for example, bothering neighbors (e.g. within a "late-night" listening mode). Many devices, typically with small form-factor loudspeakers, cannot reproduce sound at high output levels or cannot reproduce sound without perceptible distortion. In some cases the lower signal levels may be reproduced below the human hearing threshold. The DRC techniques may perform mapping of input loudness levels to output loudness levels based on DRC gains (e.g., scaling factors that scale audio amplitudes, boost ratios, cut ratios, etc.) looked up with a dynamic range compression curve.

A dynamic range compression curve refers to a function (e.g., a lookup table, a curve, a multi-segment piecewise lines, etc.) that maps individual input loudness levels (e.g., of sounds other than dialogues, etc.) as determined from individual audio data frames to corresponding output loudness levels, and by consequence to individual gains or gains for dynamic range control in order to translate the input loudness levels to the corresponding output loudness levels. Each of the individual gains indicates an amount of gain to be applied to the signal to map a corresponding individual input loudness level to the intended output loudness level. Output loudness levels after applying the individual gains represent target loudness levels for audio content in the individual audio data frames in a specific playback environment.

In addition to specifying mappings between gains and loudness levels, a dynamic range compression curve may include, or may be provided with, specific release times and attack times in applying specific gains. An attack refers to an increase of signal energy (or loudness) between successive time samples, whereas a release refers to a decrease of energy (or loudness) between successive time samples. An attack time (e.g., 10 milliseconds, 20 milliseconds, etc.) refers to a time constant used in smoothing DRC gains when the corresponding signal is in attack mode. A release time (e.g., 80 milliseconds, 100 milliseconds, etc.) refers to a time constant used in smoothing DRC gains when the corresponding signal is in release mode. In some embodiments, additionally, optionally or alternatively, the time constants are used for smoothing of the signal energy (or loudness) prior to determining the DRC gain.

Different dynamic range compression curves may correspond to different playback environments (i.e. to different rendering modes). For example, a dynamic range compression curve for a playback environment of a flat panel TV may be different from a dynamic range compression curve for a playback environment of a portable device. A playback device may have two or more playback environments. For example, a first dynamic range compression curve for a first playback environment of a portable device with speakers may be different from a second dynamic range compression curve for a second playback environment of the same portable device with headset.

Figure 1:
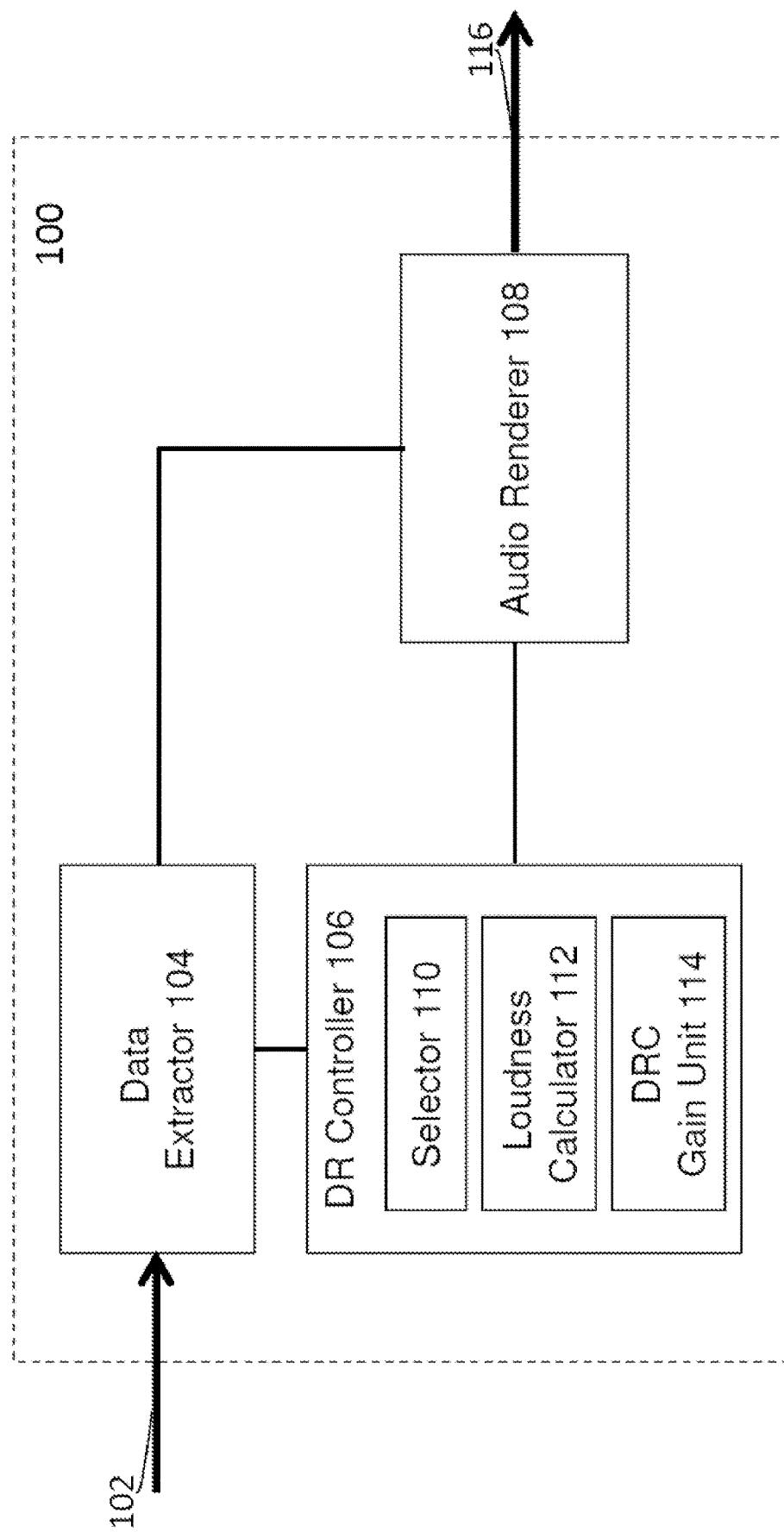

FIG. 1 shows a block diagram of example components of an audio decoder 100. The audio decoder 100 comprises a data extractor 104, a dynamic range controller 106, and an audio renderer 108. The data extractor 104 is configured to receive an encoded input signal 102. An encoded input signal 102 as described herein may be a bitstream that contains encoded (e.g., compressed, etc.) input audio data frames (notably a sequence of audio frames) and possibly metadata. The bitstream may be an AC-4 bitstream. The data extractor 104 is configured to extract/decode input audio data frames and metadata from the encoded input signal 102. Each of the input audio data frames comprises a plurality of coded audio data blocks each of which represents a plurality of audio samples. Each frame represents a (e.g., constant) time interval comprising a certain number of audio samples. The frame size may vary with the sample rate and coded data rate. The audio samples are quantized audio data elements (e.g., input PCM samples, input time-frequency samples in a QMF matrix, etc.) representing spectral content in one, two or more (audio) frequency bands or frequency ranges. The quantized audio data elements in the input audio data frames may represent sound pressure waves in a digital (quantized) domain. The quantized audio data elements may cover a finite range of loudness levels at or below a largest possible value (e.g., a clipping level, a maximum loudness level, etc.).

The metadata can be used by the audio decoder 100 to process the input audio data frames. The metadata may include a variety of operational parameters relating to one or more operations to be performed by the decoder 100, one or more dynamic range compression curves (i.e. one or more DRC profiles), normalization parameters relating to dialogue loudness levels represented in the input audio data frames, etc. A dialogue loudness level may refer to a (e.g., psychoacoustic, perceptual, etc.) level of dialogue loudness, program loudness, average dialogue loudness, etc., in an entire program (e.g., a movie, a TV program, a radio broadcast, etc.), a portion of a program, a dialogue of a program, etc.

The operation and functions of the decoder 100, or some or all of the modules (e.g., the data extractor 104, the dynamic range controller 106, etc.), may be adapted in response to the metadata extracted from the encoded input signal 102. For example, the metadata—including but not limited to dynamic range compression curves, dialogue loudness levels, etc.—may be used by the decoder 100 to generate output audio data elements (e.g., output PCM samples, output time-frequency samples in a QMF matrix, etc.) in the digital domain. The output data elements can then be used to drive audio channels or speakers to achieve a specified loudness or reference reproduction level during playback in a specific playback environment.

The dynamic range controller 106 may be configured to receive some or all of the audio data elements in the input audio data frames and the metadata, perform audio processing operations (e.g., dynamic range control operations, gain smoothing operations, gain limiting operations, etc.) on the audio data elements in the input audio data frames based at least in part on the metadata extracted from the encoded audio signal 102, etc.

In particular, the dynamic range controller 106 may comprise a selector 110, a loudness calculator 112 and/or DRC gain unit 114. The selector 110 may be configured to determine a speaker configuration (e.g., home theatre mode, flat panel mode, portable device with speakers mode, portable device with headphones mode, a 5.1 speaker configuration mode, a 7.1 speaker configuration mode, etc.) relating to a specific playback environment at the decoder 100. The speaker configuration may also be referred to as the rendering mode. Furthermore, the selector 110 may be configured to select a specific dynamic range compression curve (i.e. a DRC profile) from the dynamic range compression curves (i.e. from the plurality of DRC profiles) extracted from the metadata of the encoded input signal 102.

The loudness calculator 112 may be configured to calculate one or more types of loudness levels as represented by the audio data elements in the input audio data frames. Examples of types of loudness levels include, but are not limited to: any of individual loudness levels over individual frequency bands in individual channels over individual time intervals, broadband (or wideband) loudness levels over a broad (or wide) frequency range in individual channels, loudness levels as determined from or smoothed over an audio data block or frame, loudness levels as determined from or smoothed over more than one audio data block or frame, loudness levels smoothed over one or more time intervals, etc. Zero, one or more of these loudness levels may be altered for the purpose of dynamic range control by the decoder 100.

To determine the loudness levels, the loudness calculator 112 can determine one or more time-dependent physical sound wave properties such as spatial and/or local pressure levels at specific audio frequencies, etc., as represented by the audio data elements in the input audio data frames. The loudness calculator 112 can use the one or more time-varying physical wave properties to derive one or more types of loudness levels based on one or more psychoacoustic functions modeling human loudness perception. A psychoacoustic function may be a non-linear function—as constructed based on a model of the human auditory system—that converts/maps specific spatial pressure levels at specific audio frequencies to specific loudness for the specific audio frequencies.

A (e.g., broadband, wideband, etc.) loudness level over multiple (audio) frequencies or multiple frequency bands may be derived through integration of specific loudness levels over the multiple (audio) frequencies or multiple frequency bands. Time-averaged, smoothed, etc., loudness levels over one or more time intervals (e.g., longer than that represented by audio data elements in an audio data block or frame, etc.) may be obtained by using one or more smoothing filters that are implemented as a part of the audio processing operations in the decoder 100. Another example method for determining a (broadband) loudness level is specified in ITU-R BS.1770. The method which is specified in ITU-R BS.1770 applies time domain filtering on a time domain input audio signal and then calculates an RMS (root mean square) level on each channel of the input audio signal before integrating over the channels and gating the resulting loudness level.

A specific loudness level for different frequency bands may be calculated per audio data block of certain (e.g., 256, etc.) samples. Pre-filters may be used to apply frequency weighting (e.g., similar to IEC B-weighting, etc.) to the specific loudness levels in integrating the specific loudness levels into a broadband (or wideband) loudness level. A summation of broad loudness levels over two or more channels (e.g., left front, right front, center, left surround, right surround, etc.) may be performed to provide an overall loudness level of the two or more channels.

An overall loudness level may refer to a broadband (wideband) loudness level in a single channel (e.g., center, etc.) of a speaker configuration. An overall loudness level may refer to a broadband (or wideband) loudness level in a plurality of channels. The plurality of channels may be all channels in a speaker configuration (i.e. for a rendering mode). Additionally, optionally or alternatively, the plurality of channels may comprise a subset of channels (e.g., a subset of channels comprising left front, right front, and low frequency effect (LFE); a subset of channels comprising left surround and right surround; a subset of channels comprising center; etc.) in a speaker configuration.

A (e.g., broadband, wideband, overall, specific, etc.) loudness level may be used as input to look up a corresponding (e.g., static, pre-smoothing, pre-limiting, etc.) DRC gain from the selected dynamic range compression curve. The loudness level to be used as input to look up the DRC gain may be first adjusted or normalized with respect to a dialogue loudness level from the metadata extracted from the encoded audio signal 102 and/or with respect to an output reference level of the rendering mode. The adjustments and normalization related to adjusting the dialogue loudness level/output reference level may be performed on a portion of the audio content in the encoded audio signal 102 in a non-loudness domain (e.g., a SPL domain, etc.), before specific spatial pressure levels represented in the portion of the audio content in the encoded audio signal 102 are converted or mapped to specific loudness levels of the portion of the audio content in the encoded audio signal 102.

The DRC gain unit 114 may be configured with a DRC algorithm to generate gains (e.g., for dynamic range control, for gain limiting, for gain smoothing, etc.) and to apply the gains to one or more loudness levels in the one or more types of loudness levels represented by the audio data elements in the input audio data frames to achieve target loudness levels for the specific playback environment. The application of gains as described herein (e.g., DRC gains, etc.) may happen in the loudness domain. By way of example, gains may be generated based on the loudness calculation (which may be in Sone or just the SPL value compensated for the dialog loudness level, for example, with no conversion), smoothed and applied directly to the input signal. Techniques as described herein may apply the gains to a signal in the loudness domain, and then convert the signal from the loudness domain back to the (linear) SPL domain and calculate corresponding gains that are to be applied to the signal by assessing the signal before and after the gain was applied to the signal in the loudness domain. The ratio (or difference when represented in a logarithmic dB representation) then determines the corresponding gain for the signal.

The DRC algorithm may operate with a plurality of DRC parameters. The DRC parameters include the dialogue loudness level that has already been computed and embedded into the encoded audio signal 102 by an upstream encoder 150 (as described in the context of FIG. 2) and can be obtained from the metadata in the encoded audio signal 102 by the decoder 100. The dialogue loudness level from the upstream encoder 150 indicates an average dialogue loudness level (e.g., per program, relative to the energy of a full-scale 1 kHz sine wave, relative to the energy of a reference rectangular wave, etc.). The dialogue loudness level extracted from the encoded audio signal 102 may be used to reduce inter-program loudness level differences. The reference dialogue loudness level may be set to the same value between different programs in the same specific playback environment at the decoder 100. Based on the dialogue loudness level from the metadata, the DRC gain unit 114 can apply a dialogue loudness related gain to each audio data block in a program such that an output dialogue loudness level (or output reference level) averaged over a plurality of audio data blocks of the program is raised/lowered to a (e.g., pre-configured, system default, user-configurable, profile dependent, etc.) reference dialogue loudness level for the program. The dialogue loudness level may also be used to calibrate the DRC algorithm, notably the null-band of the DRC algorithm may be adjusted to the dialogue loudness level. Alternatively, the desired output reference level may be used to calibrate the DRC algorithm when the DRC algorithm is applied to a signal to which a gain has been applied to change the dialogue loudness level to be equal to the desired output reference level. The dialog loudness level may correspond to a so called dialnorm parameter, if speech gating has been applied to determine the dialnorm parameter. In some embodiments, the dialog loudness level corresponds to a dialnorm parameter that is not determined by using speech gating, but by a gating based on a loudness level threshold.

The DRC gains may be used to address intra-program loudness level differences by boosting or cutting signal portions in soft and/or loud sounds in accordance with the selected dynamic range compression curve. One or more of these DRC gains may be computed/determined by the DRC algorithm based on the selected dynamic range compression curve and (e.g., broadband, wideband, overall, specific, etc.)

loudness levels as determined from one or more of the corresponding audio data blocks, audio data frames, etc.

Loudness levels used to determine (e.g., static, pre-smoothing, pre-gain limiting, etc.) DRC gains by looking up the selected dynamic range compression curve may be calculated on short intervals (e.g., approximately 5.3 milliseconds, etc.). The integration time of the human auditory system (e.g., approximately 200 milliseconds, etc.) may be much longer. The DRC gains obtained from the selected dynamic range compression curve may be smoothed with a time constant to take into account the long integration time of the human auditory system. To effectuate fast rates of changes (increases or decreases) in loudness levels, short time constants may be used to cause changes in loudness levels in short time intervals corresponding to the short time constants. Conversely, to effectuate slow rates of changes (increases or decreases) in loudness levels, long time constants may be used to changes in loudness levels in long time intervals corresponding to the long time constants.

The human auditory system may react to increasing loudness levels and decreasing loudness levels with different integration time. Different time constants may be used for smoothing the static DRC gains looked up from the selected dynamic range compression curves, depending on whether the loudness level will be increasing or decreasing. For example, in correspondence with the characteristics of the human auditory system, attacks (loudness level increasing) may be smoothed with relatively short time constants (e.g., attack times, etc.), whereas releases (loudness level decreasing) may be smoothed with relatively long time constants (e.g., release time, etc.).

A DRC gain for a portion (e.g., one or more of audio data blocks, audio data frames, etc.) of audio content may be calculated using a loudness level determined from the portion of audio content. The loudness level to be used for looking up in the selected dynamic range compression curve may be first adjusted with respect to (e.g., in relation to, etc.) a dialogue loudness level (e.g., in a program of which the audio content is a part, etc.) in the metadata extracted from the encoded audio signal 102.

A reference dialogue loudness level/output reference level (e.g., −31 $dB_{FS}$ in the "Line" mode, −20 $dB_{FS}$ in the "RF" mode, etc.) may be specified or established for the specific playback environment at the decoder 100. Additionally, alternatively or optionally, in some embodiments, users may be given control over setting or changing the reference dialogue loudness level at the decoder 100.

The DRC gain unit 114 may be configured to determine a dialogue loudness related gain to the audio content to cause a change from the input dialogue loudness level to the reference dialogue loudness level as the output dialogue loudness level.

The audio renderer 108 may be configured to generate (e.g., multi-channel, etc.) channel-specific audio data 116 for the specific speaker configuration after applying gains as determined based on DRC, gain limiting, gain smoothing, etc., to the input audio data extracted from the encoded audio signal 102. The channel-specific audio data 116 may be used to drive speakers, headphones, etc., represented in the speaker configuration.

Additionally and/or optionally, the decoder 100 may be configured to perform one or more other operations relating to processing, rendering, downmixing, resampling etc., relating to the input audio data.

Techniques as described herein can be used with a variety of speaker configurations corresponding to a variety of different surround sound configurations (e.g., 2.0, 3.0, 4.0, 4.1, 4.1, 5.1, 6.1, 7.1, 7.2, 10.2, a 10-60 speaker configuration, a 60+ speaker configuration, object signals or combinations of object signals, etc.) and a variety of different rendering environment configurations (e.g., cinema, park, opera houses, concert halls, bars, homes, auditoriums, etc.).

Figure 2:
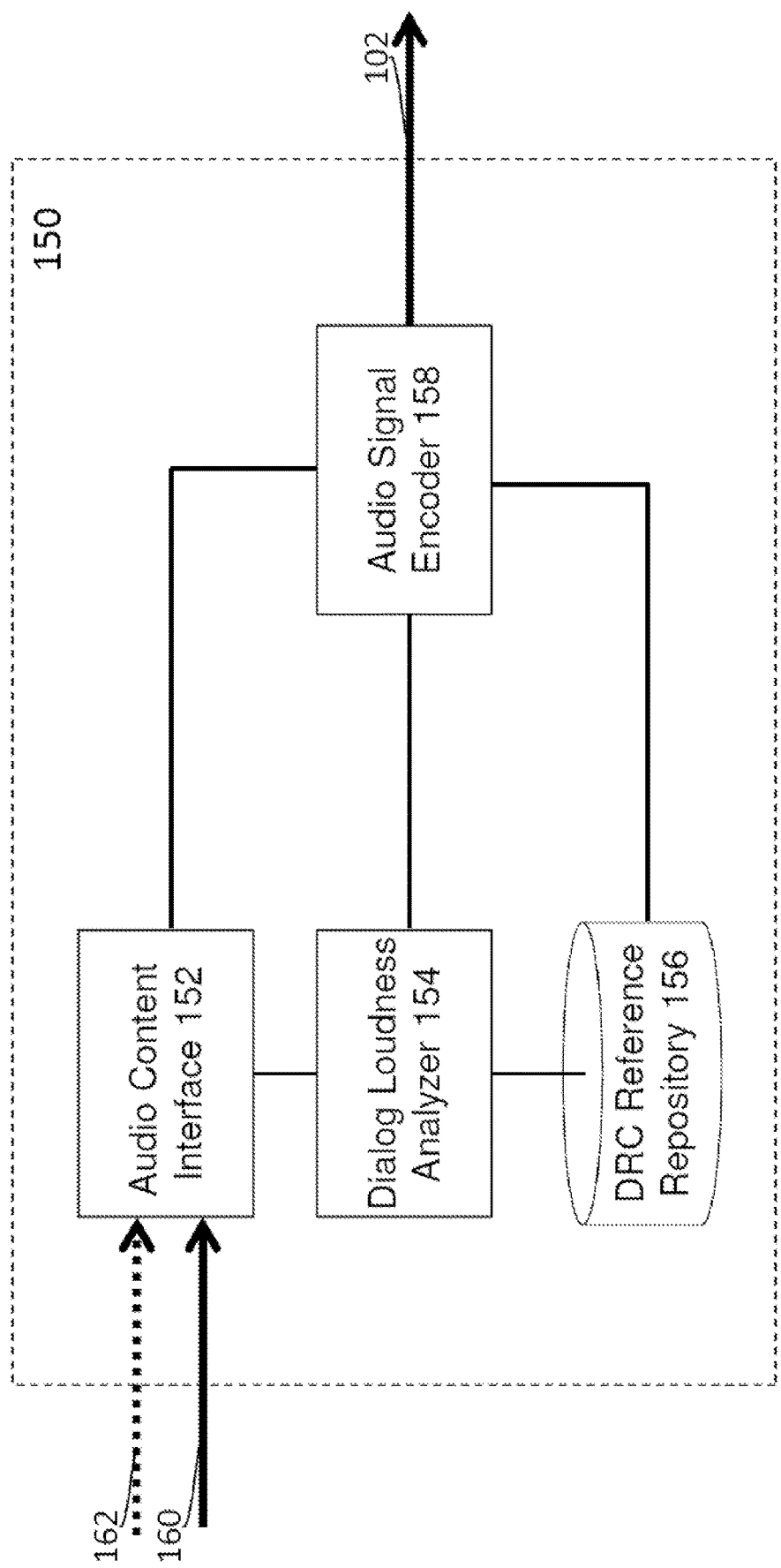

FIG. 2 illustrates an example encoder 150. The encoder 150 may comprise an audio content interface 152, a dialogue loudness analyzer 154, a DRC reference repository 156 and an audio signal encoder 158. The encoder 150 may be a part of a broadcast system, an internet-based content server, an over-the-air network operator system, a movie production system, etc.

The audio content interface 152 may be configured to receive audio content 160 and audio content control input 162 for generating an encoded audio signal 102 based at least on some or all of the audio content 160 and the audio content control input 162. For example, the audio content interface 152 may be used to receive the audio content 160 and the audio content control input 162 from a content creator, a content provider, etc.

The audio content 160 may constitute some or all of overall media data that comprises audio only, audiovisual, etc. The audio content 160 may comprise one or more of portions of a program, a program, several programs, one or more commercials, etc.

The dialogue loudness analyzer 154 may be configured to determine/establish one or more dialogue loudness levels of one or more portions (e.g., one or more programs, one or more commercials, etc.) of the audio content 152. The audio content may be represented by one or more sets of audio tracks. Dialogue audio content of the audio content may be in separate audio tracks and/or at least a portion of dialogue audio content of the audio content may be in audio tracks comprising non-dialogue audio content.

The audio content control input 162 may comprise some or all of user control input, control input provided by a system/device external to the encoder 150, control input from a content creator, control input from a content provider, etc. For example, a user such as a mixing engineer, etc., can provide/specify one or more dynamic range compression curve identifiers; the identifiers may be used to retrieve one or more dynamic range compression curves that fit the audio content 160 best from a data repository such as a DRC reference repository (156), etc.

The DRC reference repository 156 may be configured to store DRC reference parameter sets, etc. The DRC reference parameter sets may include definition data for one or more dynamic range compression curves, etc. The encoder 150 may (e.g., concurrently) encode more than one dynamic range compression curve into the encoded audio signal 102. Zero, one, or more of the dynamic range compression curves may be standard-based, proprietary, customized, decoder-modifiable, etc. By way of example, the dynamic range compression curves of FIG. 3 and FIG. 4 may be (e.g., concurrently) encoded into the encoded audio signal 102.

The audio signal encoder 158 may be configured to receive the audio content from the audio content interface 152, the dialogue loudness levels from the dialogue loudness analyzer 154, retrieve one or more DRC reference parameter sets (i.e. DRC profiles) from the DRC reference repository 156, format audio content into audio data blocks/frames, format the dialogue loudness levels, the DRC reference parameter sets, etc., into metadata (e.g., metadata containers, metadata fields, metadata structures, etc.) and encode the audio data blocks/frames and the metadata into the encoded audio signal 102.

Audio content to be encoded into an encoded audio signal 102 as described herein may be received in one or more of a variety of source audio formats in one or more of a variety of ways, such as wirelessly, via a wired connection, through a file, via an internet download, etc.

any of: boost ratios, cut ratios, attack times, release times, etc.) are shown in the following table. The different profiles (e.g., film standard, film light, music standard, music light, speech, etc.) may be different for different playback environments (e.g., at the decoder 100):

TABLE 1

| Parameter | Profile | | | | |
|---|---|---|---|---|---|
| | Film standard | Film light | Music Standard | Music light | Speech |
| Time Constant Selection | | | | | |
| Attack Threshold (dB) | 15 | 15 | 15 | 15 | 10 |
| Release Threshold (dB) | 20 | 20 | 20 | 20 | 10 |
| Fast Attack Time Constant (ms) | 10 | 10 | 10 | 10 | 10 |
| Slow Attack Time Constant (ms) | 100 | 100 | 100 | 100 | 100 |
| Slow Release Time Constant (ms) | 3000 | 3000 | 10000 | 3000 | 1000 |
| Fast Release Time Constant (ms) | 1000 | 1000 | 1000 | 1000 | 200 |
| Holdoff period (ms) | 53 | 53 | 53 | 53 | 53 |
| Compression Curve | | | | | |
| Maximum Boost (dB) | 6 | 6 | 12 | 12 | 15 |
| Maximum Boost Range (<=dB) | −43 | −53 | −55 | −65 | −50 |
| Boost Ratio | 2:1 | 2:1 | 2:1 | 2:1 | 19:15 |
| Boost Range (dB) | [−43, . . . , −31] | [−53, . . . , −41] | [−55, . . . , −31] | [−65, . . . , −41] | [−50, . . . , −31] |
| Null Band Width (dB) | 5 | 20 | 5 | 20 | 5 |
| Null Band Range (dB) | [−31, . . . , −26] | [−41, . . . , −21] | [−31, . . . , −26] | [−41, . . . , −21] | [−31, . . . , −26] |
| Cut Ratio | 2:1 | 2:1 | 2:1 | 2:1 | 2:1 |
| Cut Ratio Range (dB) | [−26, . . . , −16] | [−21, . . . , −11] | [−26, . . . , −16] | [−21, . . . , 27] | [−26, . . . , −16] |
| Secondary Cut Ratio | 20:19 | 20:19 | 20:19 | | 20:19 |
| Secondary Cut Ratio Range (dB) | [−16, . . . , 4] | [−11, . . . , 9] | [−16, . . . , 4] | | [−16, . . . , 4] |
| Maximum Cut (dB) | −24 | −24 | −24 | −24 | −24 |
| Maximum Cut Range (>=dB) | 4 | 9 | 4 | 27 | 4 |

An encoded audio signal 102 as described herein can be a part of an overall media data bitstream (e.g., for an audio broadcast, an audio program, an audiovisual program, an audiovisual broadcast, etc.). The media data bitstream can be accessed from a server, a computer, a media storage device, a media database, a media file, etc. The media data bitstream may be broadcasted, transmitted or received through one or more wireless or wired network links. A media data bitstream may also be communicated through an intermediary such as one or more of network connections, USB connections, wide area networks, local area networks, wireless connections, optical connections, buses, crossbar connections, serial connections, etc.

Any of the components depicted (e.g., FIG. 1, FIG. 2) may be implemented as one or more processes and/or one or more IC circuits (e.g., ASICs, FPGAs, etc.), in hardware, software, or a combination of hardware and software.

Figure 3:
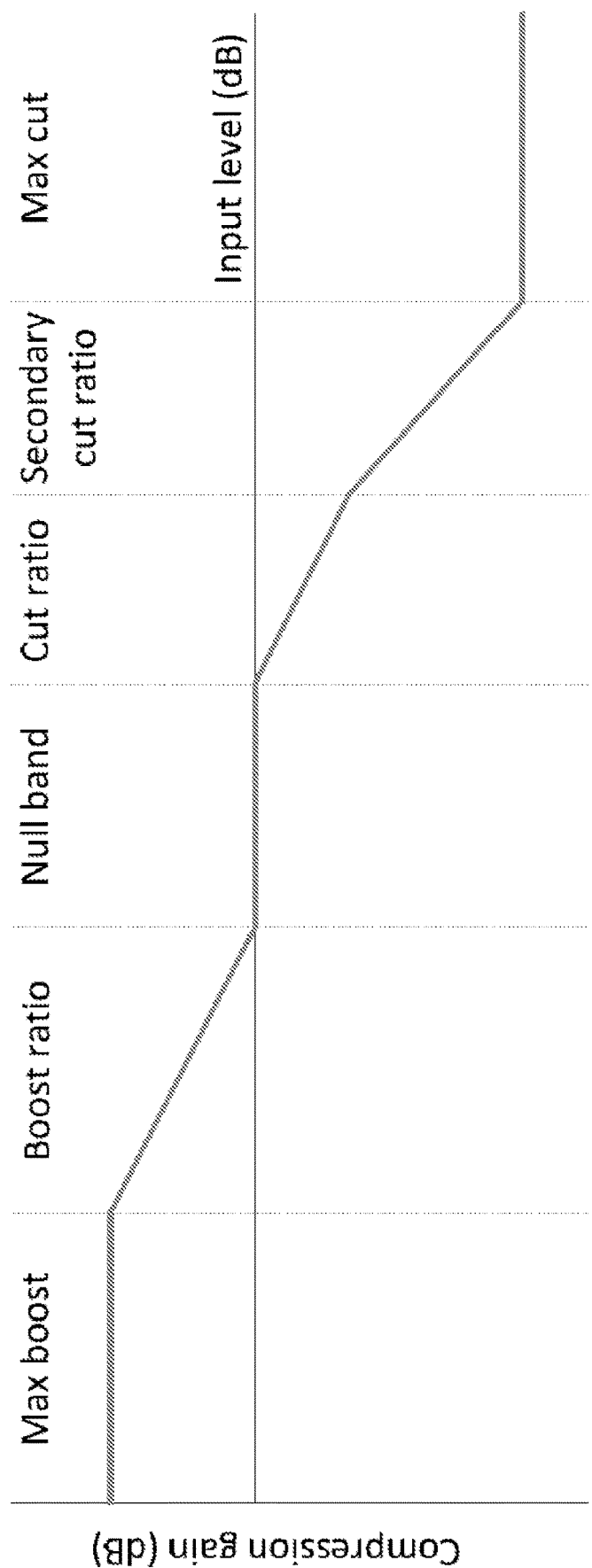
FIG. 3 and FIG. 4 illustrate example dynamic range compression curves.
Figure 4:
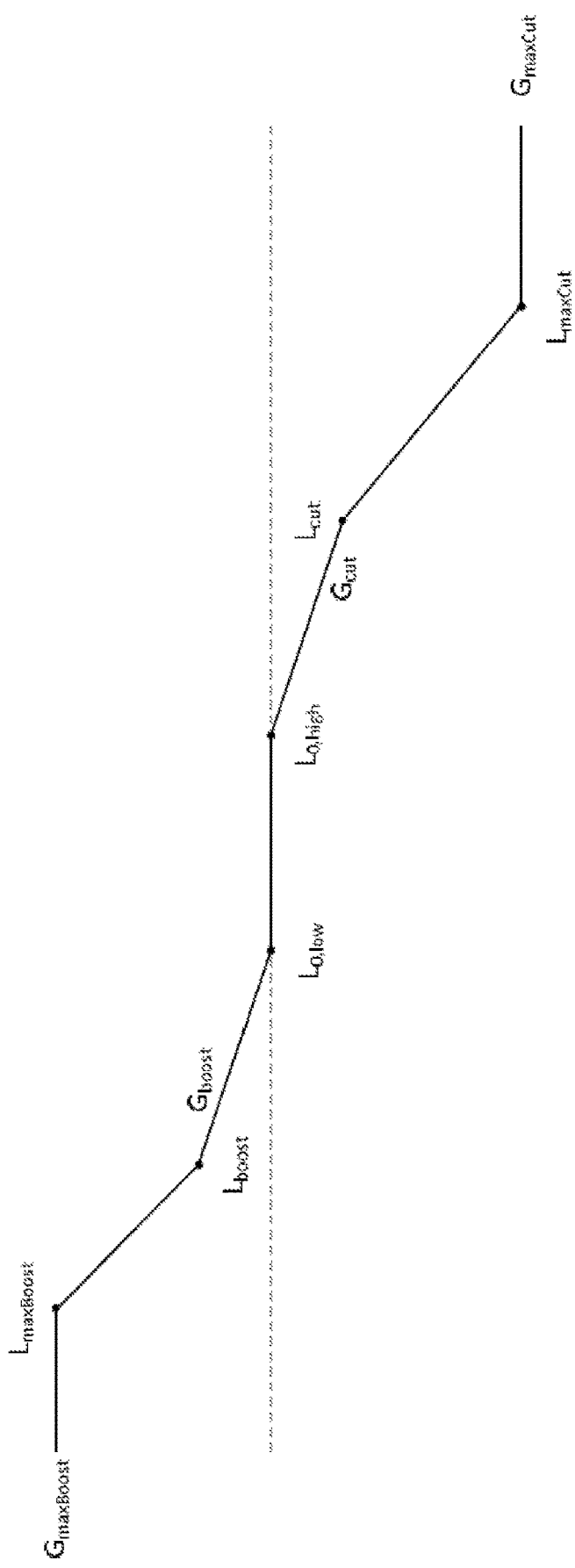

FIG. 3 and FIG. 4 illustrate example dynamic range compression curves that can be used by the DRC gain unit 104 in the decoder 100 to derive the DRC gains from input loudness levels. As illustrated, a dynamic range compression curve may be centered around a reference loudness level (e.g. the output reference level) in a program in order to provide overall gains that are appropriate for the specific playback environment. Example definition data (e.g., in the metadata of the encoded audio signal 102) of the dynamic range compression curve (e.g., including but not limited to One or more compression curves described in terms of loudness levels in $dB_{SPL}$ or $dB_{FS}$ and gains in dB relating to $dB_{SPL}$ may be received, whereas DRC gain calculation is performed in a different loudness representation that has a non-linear relation with $dB_{SPL}$ loudness levels (e.g. Sone). The compression curve used in the DRC gain calculation may then be converted to be described in terms of the different loudness representation (e.g. Sone).

Figure 5:
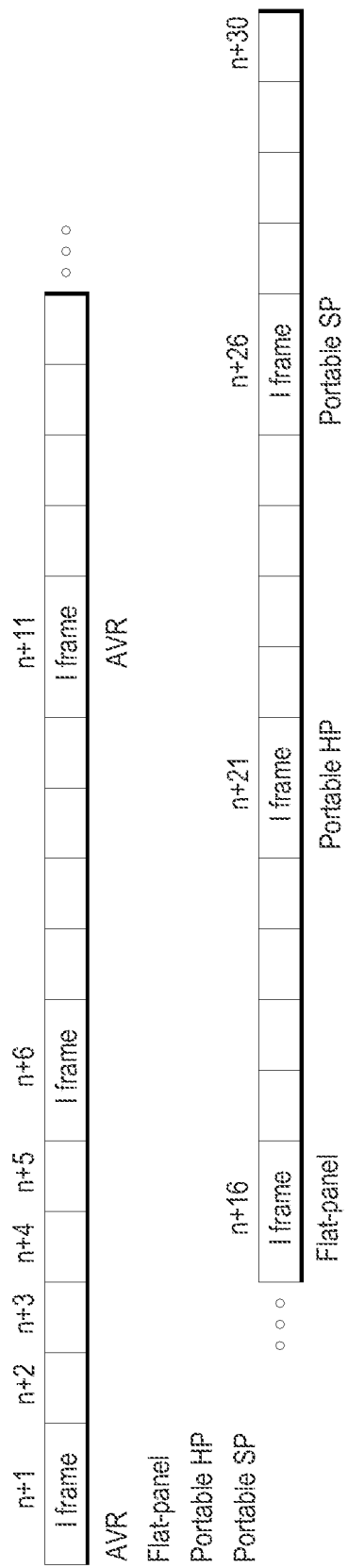
FIG. 5 illustrates an example sequence of frames.

FIG. 5 illustrates an example encoded audio signal 102 which comprises a sequence of frames (numbered as n+1 up to n+30, with n being an integer). In the illustrated example, every 5$^{th}$ frame is an I-frame. In the illustrated example, the I-frame (n+1) comprises a plurality of DRC profiles (identified as AVR (Audio/Video Receiver) for a home theatre, Flat-panel, Portable HP (headphone) and Portable SP (speakers)). Each DRC profile comprises a dynamic range compression curve as shown in FIGS. 3 and 4.

The plurality of DRC profiles may be inserted repeatedly within the I-frames of the sequence of frames. This allows a decoder 100 to determine the appropriate DRC profile for the encoded audio signal 102 and for a current rendering mode upon startup of the encoded audio signal 102, upon tune-in into a running audio program and/or subsequent to a splicing point. On the other hand, the repeated transmission of a complete set of DRC profiles leads to a relatively high bitstream overhead. In view of this, it is proposed to transmit changing subsets of DRC profiles within the I-frames of the encoded audio signal 102.

FIG. 5 illustrates an example for inserting DRC profiles within a sequence of frames. In the illustrated example, only a single DRC profile from the complete set of DRC profiles is inserted into an I-frame. The DRC profile which is inserted into an I-frame changes from I-frame to I-frame, and by consequence, subsequent to N I-frames (with N=4 in the illustrated example), the decoder 100 has received the complete set of N DRC profiles. By doing this, the data rate for transmitting the complete set of DRC profiles can be reduced, while at the same time ensuring that the decoder 100 receives the complete set of DRC profiles within a reasonable amount of time.

FIG. 6A and FIG. 6B show a flow chart of an example method 600 for determining a DRC profile for decoding a frame of an encoded audio signal 102. The method 600 may be executed by the decoder 100 (notably by the selector 110). Upon start of reception of the encoded audio signal 102, the DRC profile which is used by the decoder 100 may be initialized. The DRC profile which is used for decoding a current frame of the encoded audio signal 102 may be referred to as the current DRC profile. As such, upon startup, the current DRC profile may be initialized. In particular, a default DRC profile (which is available at the decoder 100) may be set to be the current DRC profile which is used for rending the current frame (method step 601). Hence, a variable "profile" may be set to a default DRC profile (profile=Default DRC Profile). Furthermore, the decoder 100 may track a previously used profile. The previously used profile may be set to undefined (prev_profile=undefined).

The method 600 may further comprise the step 602 of fetching a new frame which is to be decoded (i.e. the current frame) from the encoded audio signal 102. In step 603, it is verified, whether the new frame is an I-frame which might comprise a DRC profile. If the new frame is not an I-frame, then the method 600 proceeds with step 604 and processes the new frame using the current DRC profile. Furthermore, the previously used profile is set to the current DRC profile in method step 605 (prev_profile=profile).

If the new frame is an I-frame then it may be checked in method step 606, whether the I-frame comprises DRC data. By way of example, the metadata of the I-frame may comprise a flag which is indicative of whether the I-frame comprises DRC data. If no DRC data is present, then the method 300 may proceed with steps 604, 605. Otherwise, the method may proceed with method step 607.

In method step 607 it may be verified, whether the new frame is the first frame of the encoded audio signal 102 which is to be decoded. As can be seen from the flow chart of FIG. 6A and FIG. 6B, this may be verified by checking the prev_profile variable. If the prev_profile variable is undefined, then the new frame is the first frame to be decoded. If the new frame is the first frame to be decoded, then the decoder 100 may use a predefined DRC profile other than the default DRC profile. For this purpose, the metadata of the new frame may comprise an identifier (ID) for such a predefined DRC profile. Such a predefined DRC profile may be stored within a database at the decoder 100. The use of a predefined DRC profile may provide a bitrate efficient means for signaling a to-be-used DRC profile to the decoder 100, because only the ID of the predefined profile needs to be transmitted (method step 608). Predefined DRC profiles which are signaled using an ID may also be referred to as implicit DRC profiles.

It should be noted that in some cases, it may be beneficial to only use a single predefined DRC profile other than the default DRC profile. In such a case, the decoder 100 may be configured to set the profile variable to the predefined (i.e. implicit) DRC profile, without receiving any ID within the metadata of the new frame.

The method 600 may further comprise verifying whether the metadata of the new frame comprises one or more explicit DRC profiles (step 609). An explicit DRC profile may comprise an ID for identifying the explicit DRC profile. Furthermore, the explicit DRC profile typically comprises definition data for a dynamic range compression curve as illustrated in FIGS. 3 and 4. The dynamic range compression curve may be defined as a piecewise linear function. Furthermore, the explicit DRC profile may indicate a range of output reference levels (ORL) for which the explicit DRC profile is applicable. By way of example, the default DRC profile and/or the predefined (implicit) DRC profile may be applicable for output reference levels which range from −31 dB FS up to 0 dB FS.

The ORL of a rendering device may indicate the dynamic range capabilities of the rendering device. Typically the dynamic range capabilities decrease with increasing ORL. In case of a high ORL, compression curves with a high degree of compression should be used, in order to render an audio signal in an intelligible manner without clipping. On the other hand, in case of a low ORL, compression may be reduced to render audio signals with a high dynamic range. Due to the high dynamic range capabilities of the rendering device, intelligibility of the audio signal is nevertheless ensured.

If the metadata of the new frame comprises at least one explicit DRC profile, the profile data of a first DRC profile is read (step 610). Furthermore, it is verified whether the range of ORL of the first DRC profile is applicable to the currently used rendering device (step 611). If this is not the case, then the method 600 proceeds to look for another explicit DRC profile within the metadata of the new frame. On the other hand, if an explicit DRC profile is applicable to the rendering device, then this explicit DRC profile may be set to be the current DRC profile, which is to be used for processing the new frame (step 614).

The method 600 may further comprise verifying whether a headphone rendering mode is used and whether an explicit DRC profile is applicable to a headphone rendering mode (step 612). In addition, the method 600 may comprise verify whether an explicit DRC profile is an updated profile compared to a previously used profile (step 613). For this purpose, the ID of the explicit DRC profile may be compared with the ID of a currently used profile. By doing this, it can be ensured that the decoder 100 always uses the most current DRC profile.

Using method 600, it may be ensured that the decoder 100 always identifies a DRC profile for rendering a frame of an encoded audio signal 102, even if the decoder 100 has not yet received the DRC profile for the current rendering mode (i.e. for the current rendering device). Furthermore, it is ensured that the DRC profile for the current rendering mode is applied as soon as the decoder 100 receives the corresponding DRC profile.

As such, a method 600 for decoding an encoded audio signal 102 is described. The encoded audio signal 102 comprises a sequence of frames. Furthermore, the encoded audio signal 102 is indicative of a plurality of different dynamic range control (DRC) profiles for a corresponding plurality of different rendering modes. Examples for different rendering modes (or different reproduction environments) are a first DRC profile for use in a home theatre rendering mode; a second DRC profile for use in a flat panel rendering mode; a third DRC profile for use in a portable device loudspeaker rendering mode; and/or a fourth DRC profile for use in a headphone rendering mode. A DRC profile defines a specific DRC behavior. The DRC behavior may be described by means of a compression curve (and time constants) and/or by DRC gains. DRC gains may be temporal equidistant gains that may be applied the encoded audio signal 102 to deploy DRC. Compression curves may be accompanied by time constants which together configure a DRC algorithm. DRC typically reduces the volume of loud sounds and amplifies quiet sounds, thereby compressing the audio signal's dynamic range for an improved experience in non-ideal reproduction environments.

A sequence of frames typically comprises a plurality of succeeding frames which form an audio signal. An audio program (e.g. a broadcasted TV or radio program) may comprise a plurality of audio signal which are concatenated at splicing points. By way of example, a main audio program may be interrupted in a repeated manner by commercial breaks. The sequence of frames may correspond to the complete audio program. Alternatively, the sequence of frames may correspond to one of the plurality of audio signals which form the complete audio program.

Different subsets of DRC profiles from the plurality of DRC profiles may be comprised within different frames of the sequence of frames, such that two or more frames of the sequence of frames jointly comprise the plurality of DRC profiles. As indicated above, the distribution of DRC profiles across a plurality of frames of the sequence of frames leads to a reduction of a bitstream overhead for signaling the plurality of DRC profiles.

The method 600 may comprise determining a first rendering mode from the plurality of different rendering modes. In particular, it may be determined which rendering mode is used for rendering the encoded audio signal 102. Furthermore, the method 600 may comprise determining 609, 610 one or more DRC profiles from the plurality of DRC profiles which are comprised within a current frame of the sequence of frames. In other words, one or more DRC profiles from a subset of DRC profiles that is comprised within the current frame may be determined. In addition, it may be determined 611 whether at least one of the one or more DRC profiles is applicable to the first rendering mode. The determining 611 whether at least one of the one or more DRC profiles is applicable to the first rendering mode may comprise determining a first output reference level for the first rendering mode, determining a range of output reference levels that a DRC profile from the one or more DRC profiles is applicable to, and determining whether the first output reference level falls within the range of output reference levels.

The method 600 may further comprise selecting 604 a default DRC profile as a current DRC profile, if none of the one or more DRC profiles is applicable to the first rendering mode. Definition data of the default DRC profile is typically known at the decoder 100 for decoding the encoded audio signal 102. In addition, the method 600 may comprise decoding (and/or rendering) the current frame using the current DRC profile. As such, it may be ensured that a decoder 100 makes use of a DRC profile (and a dynamic range compression curve) even if the decoder 100 has not yet received a DRC profile which is specific to the encoded audio signal 102.

Alternatively or in addition, the method 600 may comprise selecting 604 a first DRC profile from the one or more DRC profiles as the current DRC profile, if the first DRC profile is determined to be applicable to the first rendering mode. As a result of this, the decoder 100 is configured to use the optimal first DRC profile for the encoded audio signal 102 and for the first rendering mode, as soon as the decoder 100 receives the first DRC profile.

The method 600 may further comprise determining 603, 606 whether the current frame of the sequence of frames comprises one or more DRC profiles from the plurality of DRC profiles, i.e. whether the current frame comprises a subset of DRC profiles. As outlined in the context of FIG. 5, subsets of DRC profiles are typically comprised within I-frames of the sequence of frames. As such, determining 603, 606 whether the current frame comprises one or more DRC profiles from the plurality of DRC profiles or whether the current frame comprises a subset of DRC profiles may comprise determining 603 whether the current frame is an I-frame. As indicated above, an I-frame may be a frame that is independently decodable from any other frames from the sequence of frames. This may be due to the fact that the data comprised in such an I-frame is transmitted in a way that it is not depending on data from previous or subsequent frames. In particular, the data comprised within an I-frame is not differentially encoded with respect to data comprised within a previous or subsequent frame.

Furthermore, determining 603, 606 whether the current frame comprises one or more DRC profiles from the plurality of DRC profiles or whether the current frame comprises a subset of DRC profiles may comprise verifying 606 a DRC profile flag comprised within the current frame. A DRC profile flag within the bitstream of the encoded audio signal provides a bandwidth and computational efficient means for identifying frames which carry DRC profiles.

The method 600 may further comprise determining whether the current frame is indicative of an implicit DRC profile from a plurality of implicit DRC profiles. An implicit DRC profile may comprise a pre-defined legacy compression curve and time constants that may be used for transcoding to E-AC-3. As indicated above, definition data of an implicit DRC profile may be known at the decoder 100 for decoding the input audio signal 102. In contrast to the default DRC profile, the implicit DRC profiles may be specific to different types of audio signals (as specified e.g. in Table 1). A current frame of the sequence of frames may indicate a particular implicit DRC profile (e.g. using an identifier, ID). This may provide a bandwidth efficient means for signaling an appropriate DRC profile for the encoded audio signal 102. The implicit DRC profile may be selected 608 as the current DRC profile, if it is determined that the current frame is indicative of an implicit DRC profile.

Decoding of the current frame may comprise leveling the sequence of frames to the first output reference level of the first rendering mode. Furthermore, decoding of the current frame may comprise adapting a loudness level of the current frame using the dynamic range compression curve which is specified within the current DRC profile. The adaption of the loudness level may be performed as outlined in the context of FIG. 1.

Depending on the number of frames from the sequence of frames, the current DRC profile may correspond to a default DRC profile (which is typically independent of the input audio signal 102), to an implicit DRC profile (which may be adapted to the input audio signal 102 in a limited manner) or to the first explicit DRC profile (which may have been designed for the input audio signal 102 and/or for the first rendering mode).

Typically, only a subset of frames comprises DRC profiles. Once a current DRC profile has been selected, the current DRC profile may be maintained for decoding frames of the sequence of frames which do not comprise any DRC profiles. Furthermore, the current DRC profile may be maintained, even upon reception of frames with DRC profiles, as long as no DRC profile is received which is more up-to-date than the current DRC profile and/or which is of higher relevance for the encoded audio signal 102 (wherein the selected first explicit DRC profile has a higher relevance than a selected implicit DRC profile which has a higher relevance than the default DRC profile). By doing this, continuity and optimality of the used DRC profile can be ensured.

In complement to the method 600 for decoding an encoded audio signal 102, a method for generating or encoding an encoded audio signal 102 is described. The encoded audio signal 102 comprises a sequence of frames. Furthermore, the encoded audio signal 102 is indicative of a plurality of different dynamic range control (DRC) profiles for a corresponding plurality of different rendering modes. The method may comprise inserting different subsets of DRC profiles from the plurality of DRC profiles into different frames of the sequence of frames, such that two or more frames of the sequence of frames jointly comprise the plurality of DRC profiles. In other words, subsets of DRC profiles, with less than the total number of DRC profiles, may be provided along with different frames of the sequence of frames. By doing this, the overhead of the encoded audio signal 102 may be reduced, while at the same time providing the complete set of DRC profiles to a corresponding decoder 100. In other words, an advantage of this approach is that an encoder 150 has an increased freedom in how to transmit DRC data. This freedom can be used to reduce the bitrate.

The sequence of frames may comprise a subsequence of I-frames (e.g. every Xth frame of the sequence of frames may be an I-frame). The different subsets of DRC profiles may be inserted into different (e.g. succeeding) I-frames of the subsequence of I-frames. In order to further reduce the bandwidth I-frames may be skipped, i.e. some of the I-frames may not comprise any DRC profile data.

A (e.g. each) subset of DRC profiles may comprise only a single DRC profile. In particular, the plurality of DRC profiles may comprise N DRC profiles, with N being an integer, N>1. The N DRC profiles may be inserted into N different frames from the sequence of frames. By doing this, the bitrate which is required for the transmission of the DRC profiles may be minimized.

The method may further comprise inserting all of the plurality of DRC profiles into a first frame of the sequence of frames (e.g. into the first frame of the sequence of frames of the audio signal). As a result of this, the rending of the encoded audio signal 102 may be started directly with the correct explicit DRC profile. As indicated above, an audio program may be subdivided into a plurality of sub audio programs, e.g. a main audio program which is interrupted by commercial breaks. It may be beneficial to insert all of the plurality of DRC profiles into the first frame of each sub-audio program. In other words, it may be beneficial to insert all of the plurality of DRC profiles directly subsequent to the one or more splicing points of an audio program which comprises a plurality of sub audio programs.

The different subsets of DRC profiles from the plurality of DRC profiles may be inserted into different frames of the sequence of frames, such that each subsequence of M directly succeeding frames from the sequence of frames jointly comprises the plurality of DRC profiles, wherein M is an integer, with M>1. In other words, the plurality of DRC profiles may be transmitted repeatedly within blocks of M frames. As a result of this, a decoder 100 has to wait at the most M frames prior to obtaining an optimal explicit DRC profile for the encoded audio signal 102.

The method may further comprise inserting a flag into a frame of the sequence of frames, wherein the flag is indicative of whether the frame comprises a DRC profile or not. Providing such a flag enables the corresponding decoder 100 to efficiently identify a frame which comprises DRC profile data.

The DRC profiles of the plurality of DRC profiles may be explicit DRC profiles which comprise (i.e. which carry) definition data for defining a dynamic range compression curve. As outlined in the present document, a dynamic range compression curve provides a mapping between an input loudness and an output loudness and/or a gain to be applied to the audio signal. In particular, the definition data may comprise one or more of: a boost gain for boosting the input loudness; a boost gain range indicating a range for the input loudness, to which the boost gain is applicable; a null band range indicating a range for the input loudness, to which a gain of 0 dB is applicable; a cut gain for attenuating the input loudness; a cut gain range indicating a range for the input loudness, to which the cut gain is applicable; a boost gain ratio indicating a transition between a null gain and the boost gain; and/or a cut gain ratio indicating a transition between the null gain and the cut gain.

The method may further comprise inserting an indication (e.g. an identifier, ID) of an implicit DRC profile, wherein definition data of an implicit DRC profile is typically known to a decoder 100 of the encoded audio signal 102. The indication of an implicit DRC profile may provide a bandwidth efficient means for signaling a DRC profile which is adapted (in a limited manner) to the encoded audio signal 102.

As outlined above, a frame of the sequence of frames typically comprises audio data and metadata. A subset of DRC profiles is typically inserted as metadata.

A DRC profile may comprise definition data for defining a range of output reference levels for which the DRC profile is applicable. The output reference level is typically indicative of a dynamic range of a rendering mode. In particular, the dynamic range of the rendering mode may decrease with increasing output reference level, and vice versa. Furthermore, a maximum boost gain and a maximum cut gain of a dynamic range compression curve of a DRC profile may increase with increasing output reference level, and vice versa. As such, the output reference level provides an efficient means for selecting an appropriate DRC profile (with an appropriate dynamic range compression curve) for a particular rendering mode.

The method may further comprise generating a bitstream which comprises the encoded audio signal 102. The bitstream may be an AC4 bitstream, i.e. the bitstream may be compliant with an AC4 bitstream format.

The method may further comprise inserting explicit DRC gains for the encoded audio signal 102 into a frame of the sequence of frames. In particular, a DRC gain which is applicable to a particular frame of the sequence of frames may be inserted into the particular frame. As such, each frame of the sequence of frames may comprise a DRC data component which comprises one or more explicit DRC gains to be applied to the respective frame. In particular, each frame may comprise different explicit DRC gains for different rendering modes. For this purpose, DRC algorithms for different rendering modes may be applied within an encoder 150, and different DRC gains for the different rendering modes may be determined at the encoder 150. The different DRC gains may then be inserted explicitly within the sequence of frames. As a result of this, the corresponding decoder 100 can apply the explicit DRC gains directly, without performing the DRC algorithm using a dynamic range compression curve.

Hence, a sequence of frames may comprise or may be indicative of a plurality of explicit DRC profiles for signaling dynamic range compression curves for a plurality of corresponding rendering modes. The plurality of DRC profiles may be inserted into some (not all) of the frames (e.g. the I-frames) of the sequence of frames. Furthermore, the sequence of frames may comprise or may be indicative of one or more DRC profiles for a corresponding one or more rendering modes, wherein the one or more DRC profiles indicate that explicit DRC gains for one or more rendering modes are inserted into the frames of the sequence of frames. By way of example, the one or more DRC profiles for signaling explicit DRC gains may comprise a flag that indicates whether explicit DRC gains are comprised in the frames of the sequence of frames. The DRC gains may be inserted into each frame of the sequence of frames. In particular, each frame may comprise the one or more DRC gains which are to be used for decoding the frame.

The method may comprise inserting a DRC profile for the explicit DRC gains into a subset of frames from the sequence of frames. By way of example, the DRC profile for which DRC gains are transmitted may be indicative of DRC configuration data for the explicit gains. Specifically, the DRC profile for which DRC gains are transmitted may be included in all said subsets of DRC profiles. The DRC configuration data (e.g. a flag) may indicate that the sequence of frames comprises explicit DRC gains for a particular rendering mode. By doing this, the decoder 100 is informed about the fact that for the particular rendering mode, the explicit DRC gains are to be derived directly from the frames of the sequence of frames.

Hence, the method may further comprise determining explicit DRC gains for the encoded audio signal 102 for a particular rendering mode. In addition, the method may comprise inserting the explicit DRC gains into the frames of the sequence of frames. An explicit DRC gain may be inserted into the frame from the sequence of frames for which the explicit DRC gain is applicable. Furthermore, a frame from the sequence of frames may comprise the one or more explicit DRC gains which are required for decoding the frame within the particular rendering mode.

The method may further comprise inserting a DRC profile indicative of DRC configuration data for the particular rendering mode into a subset of frames from the sequence of frames (e.g. into the I-frames). The DRC configuration data (comprising e.g. a flag) may be indicative of the fact that for the particular rendering mode, explicit DRC gains are comprised within the frames of the sequence of frames. As such, the decoder 100 may determine efficiently whether to use compression curves from a plurality of DRC profiles for signaling dynamic range compression curves or whether to use explicit DRC gains.

The DRC profiles for signaling dynamic range compression curves and the one or more DRC profiles which point to explicit DRC gains may be comprised within a dedicated syntax element (referred to e.g. as a DRC profile syntax element) of an I-frame of the sequence of frames.

The methods and systems described in the present document may be implemented as software, firmware and/or hardware. Certain components may e.g. be implemented as software running on a digital signal processor or microprocessor. Other components may e.g. be implemented as hardware and or as application specific integrated circuits.

The signals encountered in the described methods and systems may be stored on media such as random access memory or optical storage media. They may be transferred via networks, such as radio networks, satellite networks, wireless networks or wireline networks, e.g. the Internet. Typical devices making use of the methods and systems described in the present document are portable electronic devices or other consumer equipment which are used to store and/or render audio signals.

The invention claimed is:

1. A method for decoding an encoded audio signal; wherein the encoded audio signal comprises a sequence of frames comprising encoded audio data and metadata, the metadata including a plurality of different sets of dynamic range control, referred to as DRC, gains, wherein the encoded audio signal further comprises an indication of a loudness of the audio signal, and DRC configuration metadata in one or more frames of the sequence of frames, wherein the DRC configuration metadata indicates a plurality of DRC profiles associated with the encoded audio signal, and, for each DRC profile, a range of output reference levels for which the DRC profile is applicable, wherein each set of DRC gains corresponds to one of the plurality of DRC profiles, the method comprising:

setting a desired output reference level for the decoded audio signal;

identifying one or more of the DRC profiles for which the applicable range of output reference levels includes the desired output reference level for the decoded audio signal;

selecting one of the identified DRC profiles;

decoding the encoded audio signal;

adjusting the dynamic range of the decoded audio signal by applying the DRC gains corresponding to the selected DRC profile to the decoded audio signal;

determining a loudness related gain in response to the indication of the loudness of the audio signal and the desired output reference level for the decoded audio signal; and applying the loudness related gain to the adjusted decoded audio signal to obtain a loudness adjusted decoded audio signal having the desired output reference level; wherein the DRC gains corresponding to the selected DRC profile are temporally equidistant.

2. The method of claim 1, wherein one or more of the DRC profiles are applicable for playback in a noisy environment.

3. The method of claim 2, wherein selecting one of the identified DRC profiles comprises selecting one of the DRC profiles applicable for playback in a noisy environment.

4. The method of claim 1, wherein one or more of the DRC profiles are applicable for playback on devices with limited dynamic range.

5. The method of claim 4, wherein selecting one of the identified DRC profiles comprises selecting one of the DRC profiles applicable for playback on devices with limited dynamic range.

6. The method of claim 1, wherein one or more of the DRC profiles are applicable for playback in a late-night environment.

7. The method of claim 6, wherein selecting one of the identified DRC profiles comprises selecting one of the DRC profiles applicable for playback in a late-night environment.

8. A decoder for decoding an encoded audio signal; wherein the encoded audio signal comprises a sequence of frames comprising encoded audio data and metadata, the metadata including a plurality of different sets of dynamic range control, referred to as DRC, gains, wherein the encoded audio signal further comprises an indication of a loudness of the audio signal, and DRC configuration metadata in one or more frames of the sequence of frames, wherein the DRC configuration metadata indicates a plurality of DRC profiles associated with the encoded audio signal, and, for each DRC profile, a range of output references levels for which the DRC profile is applicable, wherein each set of DRC gains corresponds to one of the plurality of DRC profiles; wherein the decoder comprises one or more processors that:
- set a desired output reference level for the decoded audio signal;
- identify one or more of the DRC profiles for which the applicable range of output reference levels includes the desired output reference level for the decoded audio signal;
- select one of the identified DRC profiles;
- decode the encoded audio signal;
- adjust the dynamic range of the decoded audio signal by applying the DRC gains corresponding to the selected DRC profile to the decoded audio signal;
- determining a loudness related gain in response to the indication of the loudness of the audio signal and the desired output reference level for the decoded audio signal; and
- applying the loudness related gain to the adjusted decoded audio signal to obtain a loudness adjusted decoded audio signal having the desired output reference level;

wherein the DRC gains corresponding to the selected DRC profile are temporally equidistant.

9. The decoder of claim 8, wherein one or more of the DRC profiles are applicable for playback in a noisy environment.

10. The decoder of claim 9, wherein selecting one of the identified DRC profiles comprises selecting one of the DRC profiles applicable for playback in a noisy environment.

11. The decoder of claim 8, wherein one or more of the DRC profiles are applicable for playback on devices with limited dynamic range.

12. The decoder of claim 11, wherein selecting one of the identified DRC profiles comprises selecting one of the DRC profiles applicable for playback on devices with limited dynamic range.

13. The decoder of claim 8, wherein one or more of the DRC profiles are applicable for playback in a late-night environment.

14. The decoder of claim 13, wherein selecting one of the identified DRC profiles comprises selecting one of the DRC profiles applicable for playback in a late-night environment.

15. A non-transitory computer-readable storage medium comprising a sequence of instructions, wherein, when executed by an audio signal processing device, the sequence of instructions causes the audio signal processing device to perform the method of claim 1.

\* \* \* \* \*